(12) United States Patent
Dao

(10) Patent No.: US 8,890,324 B2
(45) Date of Patent: Nov. 18, 2014

(54) SEMICONDUCTOR STRUCTURE HAVING A THROUGH SUBSTRATE VIA (TSV) AND METHOD FOR FORMING

(75) Inventor: Thuy B. Dao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 455 days.

(21) Appl. No.: 12/892,622

(22) Filed: Sep. 28, 2010

(65) Prior Publication Data

US 2012/0074583 A1    Mar. 29, 2012

(51) Int. Cl.
| | | |
|---|---|---|
| H01L 23/48 | (2006.01) | |
| H01L 23/52 | (2006.01) | |
| H01L 29/40 | (2006.01) | |
| H01L 29/06 | (2006.01) | |
| H01L 21/768 | (2006.01) | |

(52) U.S. Cl.
CPC ........ *H01L 21/76898* (2013.01); *H01L 23/481* (2013.01)
USPC ........... 257/774; 257/621; 257/622; 257/773; 257/775; 257/E21.597

(58) Field of Classification Search
CPC ................ H01L 23/522; H01L 21/768; H01L 2225/06541; H01L 21/76898; H01L 23/481
USPC ........... 257/774, 775, 621, 622, 773, E21.597
See application file for complete search history.

(56) References Cited

U.S. PATENT DOCUMENTS

| | | | | |
|---|---|---|---|---|
| 4,359,776 A | * | 11/1982 | Acket et al. | 372/46.01 |
| 5,235,609 A | * | 8/1993 | Uchida et al. | 372/46.01 |
| 5,471,494 A | * | 11/1995 | Mataki et al. | 372/43.01 |
| 6,072,242 A | * | 6/2000 | Son | 257/774 |
| 6,291,875 B1 | * | 9/2001 | Clark et al. | 257/622 |
| 6,430,204 B1 | * | 8/2002 | Tanaka | 372/46.01 |
| 6,436,798 B2 | * | 8/2002 | Fu | 438/524 |
| 6,670,714 B1 | * | 12/2003 | Miyamoto et al. | 257/758 |
| 7,705,440 B2 | * | 4/2010 | Wang | 257/678 |
| 7,723,204 B2 | * | 5/2010 | Khemka et al. | 438/430 |

(Continued)

FOREIGN PATENT DOCUMENTS

JP    59004138 A  *  1/1984  ............. H01L 21/82

OTHER PUBLICATIONS

Andry et al.; "A CMOS-compatible Process for Fabricating Electrical Through-vias in Silion"; Electronic Components and Technology Conference; 2006; pp. 831-837; IEEE.

(Continued)

*Primary Examiner* — Teresa M Arroyo
(74) *Attorney, Agent, or Firm* — Joanna G. Chiu; James L. Clingan, Jr.

(57) ABSTRACT

A structure having a substrate includes an opening in the substrate having depth from a top surface of the substrate to a bottom surface of the substrate. A conductive material fills the opening. The opening has a length direction and a width direction and a first and second feature. The first feature and the second feature are spaced apart by a first length. The first feature has first width as a maximum width of the first feature, and the second feature has a second width as the maximum width of the second feature. The opening has a minimum width between the first feature and the second feature that is no more than one fifth the first length. The first width and the second width are each at least twice the minimum width.

12 Claims, 10 Drawing Sheets

(56) References Cited

U.S. PATENT DOCUMENTS

| | | | |
|---|---|---|---|
| 7,799,678 | B2 | 9/2010 | Kropewnicki et al. |
| 7,800,234 | B2* | 9/2010 | Marchi et al. ............. 257/774 |
| 2001/0032978 | A1* | 10/2001 | Hiromi ..................... 257/48 |
| 2002/0117759 | A1* | 8/2002 | Bauch et al. ............. 257/763 |
| 2006/0076640 | A1* | 4/2006 | Blair et al. ............... 257/506 |
| 2010/0032843 | A1 | 2/2010 | Chen et al. |

OTHER PUBLICATIONS

Iwasaki et al.; "A Pillar-Shaped Via Structure in a Cu-Polyimide Multilayer Substrate"; IEEE Transactions on Components, Hybrids, and Manufacturing Technology; Jun. 1990; pp. 440-443; vol. 13, No. 2; IEEE.

Knickerbocker et al.; "3D Silicon Integration"; Electronic Components and Technology Conference; 2008; pp. 538-543; IEEE.

Pares et al.; "Mid-Process Through Silicon Vias Technology using Tungsten Metallization: Process Optimization and Electrical Results"; 11th Electronics Packaging Technology Conference; 2009; pp. 772-777; IEEE.

Shapiro et al.; "Reliable Through Silicon Vias for 3D Silicon Applications"; Interconnect Technology Conference; pp. 63-65; IEEE.

Shiozawa et al.; Expansion of effective channel width for MOSFETs defined by novel T-shapes shallow trench isolation fabricated with SiON spacers and liners; Electronics Letters; May 11, 2000; pp. 910-912; vol. 36, No. 10; IEEE.

* cited by examiner

SEMICONDUCTOR STRUCTURE HAVING A THROUGH SUBSTRATE VIA (TSV) AND METHOD FOR FORMING

BACKGROUND

1. Field

This disclosure relates generally to semiconductor processing, and more specifically, to a semiconductor structure having a through substrate via (TSV).

2. Related Art

Through substrate vias (TSVs) are commonly used in a variety of semiconductor applications. TSVs extend from a top surface of a semiconductor substrate down to a bottom surface of the semiconductor substrate. They can be filled with a variety of different materials, based on the semiconductor application. In one application, they are filled with a conductive material which allows electrical connections to be made to a wafer's backside, such as for routing power or ground.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, a semiconductor structure is formed having a conductive-filled TSV for the formation of backside connections. In one embodiment, the TSV includes at least two features separated by a length in which each of the two features has a maximum width that is greater than a width of the TSV between the two features. In one embodiment, the portion of the TSV between the two features has a minimum width that is no more than one third of the length between the two features. Also, in one embodiment, the maximum width of each of the two features is at least twice the minimum width. In one embodiment, stress is introduced to the substrate surrounding the TSV when it is filled with a conductive material which causes pulling on the walls of the TSV. Therefore, in one embodiment, the two features are located at opposite ends of the TSV to help reduce the stress at the longitudinal ends of the TSV. Alternatively, one or more of the two features may instead be located elsewhere along the length of the TSV to help reduce the stress along the length of the TSV.

Figure 1:
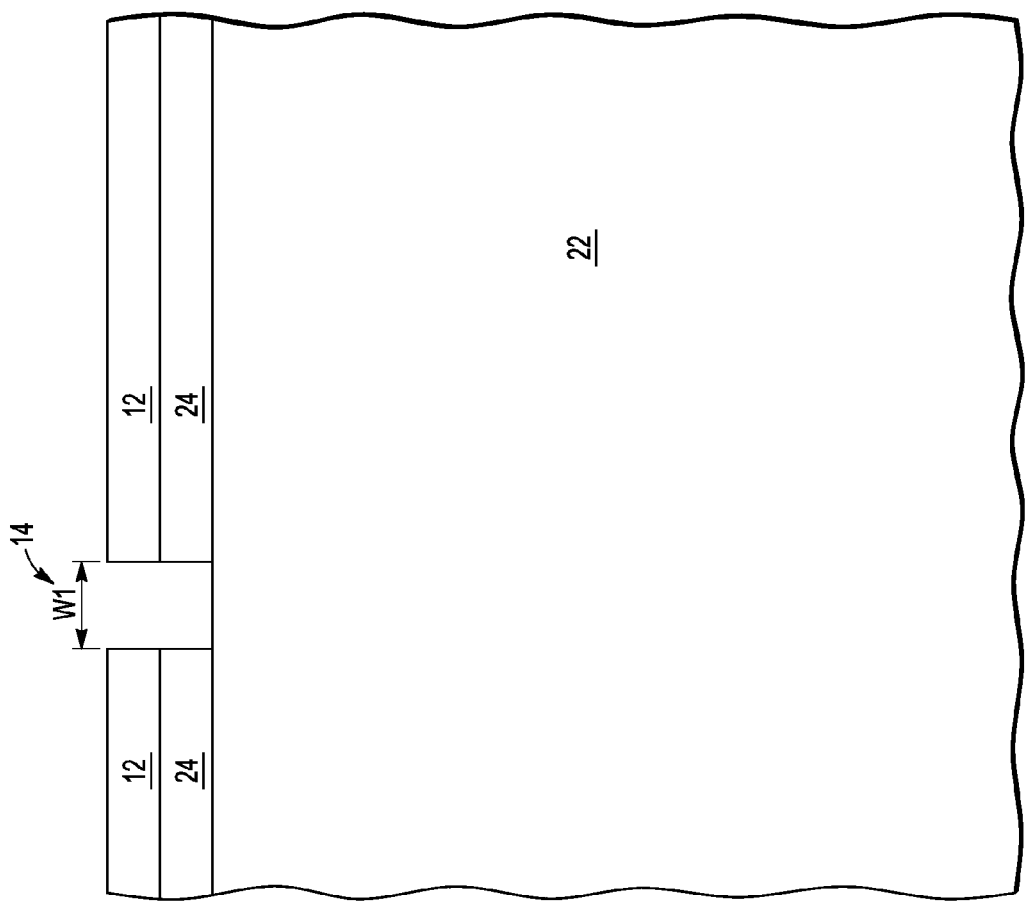
FIG. 1 illustrates a top down view of a semiconductor structure having an opening formed within a hard mask layer, in accordance with an embodiment of the present invention.

FIG. 1 illustrates a top down view of a semiconductor structure 10 having an opening 14 formed within a hard mask layer 12, in accordance with an embodiment of the present invention. Opening 14 has a length direction which runs perpendicular to the top and bottom of the page, and a width direction which runs perpendicular to the sides of the page. Opening 14 includes a substantially rectangular feature 16, a substantially rectangular feature 18, and a substantially rectangular feature 20, in which features 16 and 18 are spaced apart by a length, L1, and features 18 and 20 are also spaced apart by L1. Feature 16 has a maximum width, W2, and opening 14 has a minimum width, W1, located between feature 16 and feature 18. In one embodiment, each of features 18 and 20 also have a maximum width of W2. In one embodiment, upon subsequently filling opening 14 with a conductive material, such as tungsten, stresses result on the walls of opening 14 caused by the shrinking of the conductive material after deposition, due to the drop in temperature after completing the deposition. This stress may be especially strong at the ends of opening 14. However, due to features 16 and 20 which are located at the ends of opening 14, this stress may be reduced. Each of features 16 and 20 have a maximum width W2 that is greater than the minimum width, W1, of opening 14 and thus reshapes the ends of opening 14. This change in shape at the ends of opening 14 allows for the reduction in the stress by changing the directions of the stresses caused by the conductive fill. Furthermore, feature 18, by changing the shape along opening 14, may help reduce the stress along the length of opening 14. Any number of features, such as feature 18, may be located between features 16 and 20 (i.e. between the ends of opening 14).

In one embodiment, the minimum width W1 of the portion of opening 14 located between feature 16 and 18 is no more than one half of L1, or more preferably, no more than one third of L1, or more preferably, no more than one fifth of L1. In one embodiment, W1 is no more than one tenth of L1. That is, L1 may be at least two times, at least three times, at least five times, or at least ten times the minimum width W1. Also, in one embodiment, the maximum width W2 is in a range of two times W1 to four times W1. In one embodiment, the maximum width W2 is approximately 3 times W1. In one embodiment, each of features 16, 18, and 20 have a length, L2, which is less than the width of the feature, W2.

In this manner, opening 14 may be able to extend to a total length (L1+L1 in the illustrated embodiment) that is longer than would be possible without features 16, 18, and 20. That is, if the ends of opening 14 are not reshaped, the stresses at the ends would limit the maximum total length of opening 14 to a smaller value. However, with the addition of features 16 and 20, the stresses can be reduced, thus allowing for a greater total length. Furthermore, in one embodiment, feature 18 may not be present, or additional features may be present between features 16 and 20.

Figure 2:
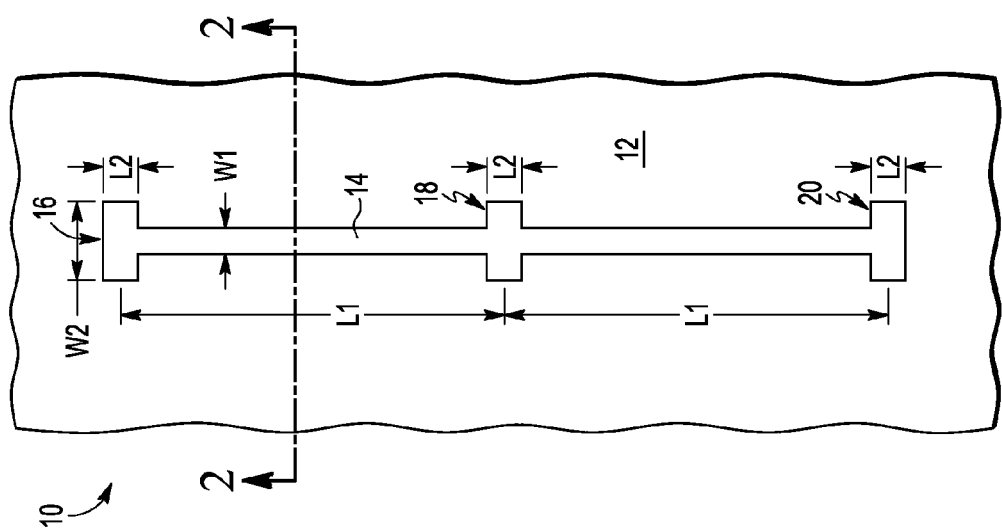
FIG. 2 illustrates a cross-sectional view of the semiconductor structure of FIG. 1, in accordance with an embodiment of the present invention.

FIG. 2 illustrates a cross-sectional view of semiconductor structure 10 of FIG. 1, in accordance with an embodiment of the present invention. Structure 10 includes a semiconductor substrate 22 having a dielectric layer 24 formed over semiconductor substrate 22, and a hard mask layer formed over dielectric layer 24. Semiconductor substrate 22 can be any semiconductor material or combinations of materials, such as gallium arsenide, silicon germanium, silicon-on-insulator (SOI), silicon, monocrystalline silicon, the like, and combinations of the above. Structure 10 also includes opening 14 which is defined by hard mask layer 12. Therefore, in one embodiment, a patterned masking layer, such as a photoresist layer, is used to pattern opening 14 into hard mask layer 12 and dielectric layer 24. In one embodiment, dielectric layer 24 may include one or more dielectric layers. The cross-section of FIG. 2 is taken between features 16 and 18 and thus has a width of W1. In one embodiment, W1 is in a range of approximately 2 to 6 microns. In one embodiment, W1 is approximately 3.5 microns.

Figure 3:
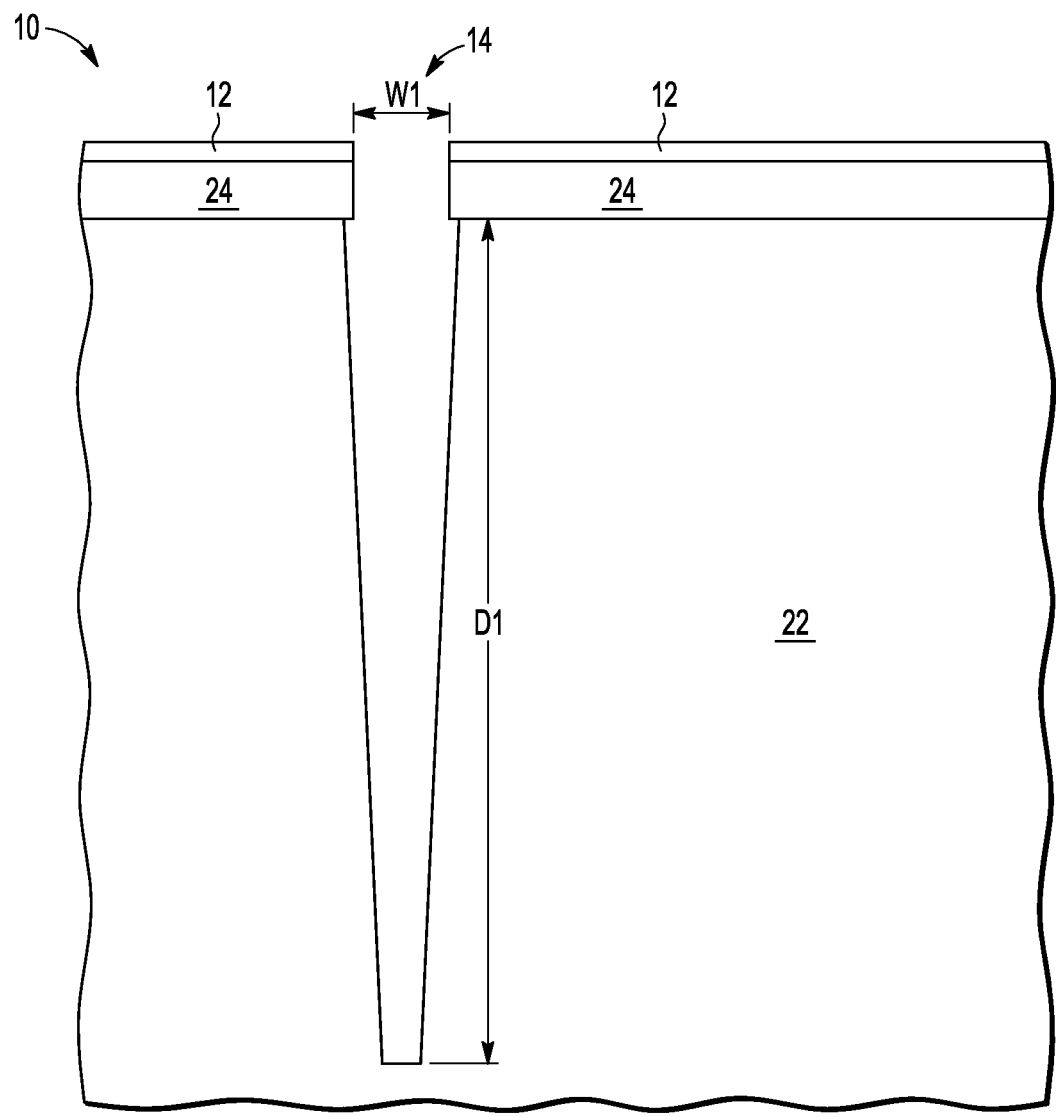
FIG. 3 illustrates a cross-sectional view of the semiconductor structure of FIG. 2 after extending the opening into the substrate, in accordance with an embodiment of the present invention.

FIG. 3 illustrates a cross-sectional view of structure 10 after extending opening 14 into substrate 22, in accordance with an embodiment of the present invention. In one embodiment, an etch is performed to extend opening 14 into substrate 22 to a depth of D1 as measured from a top surface of substrate 22 to a bottom of the opening. In one embodiment, depth D1 is in a range of 60 to 150 microns. In one embodiment, D1 is approximately 80 microns. As a result of the etch, hard mask layer 12 is also thinned. In one embodiment, about ⅔ of the hard mask layer is removed.

Figure 4:
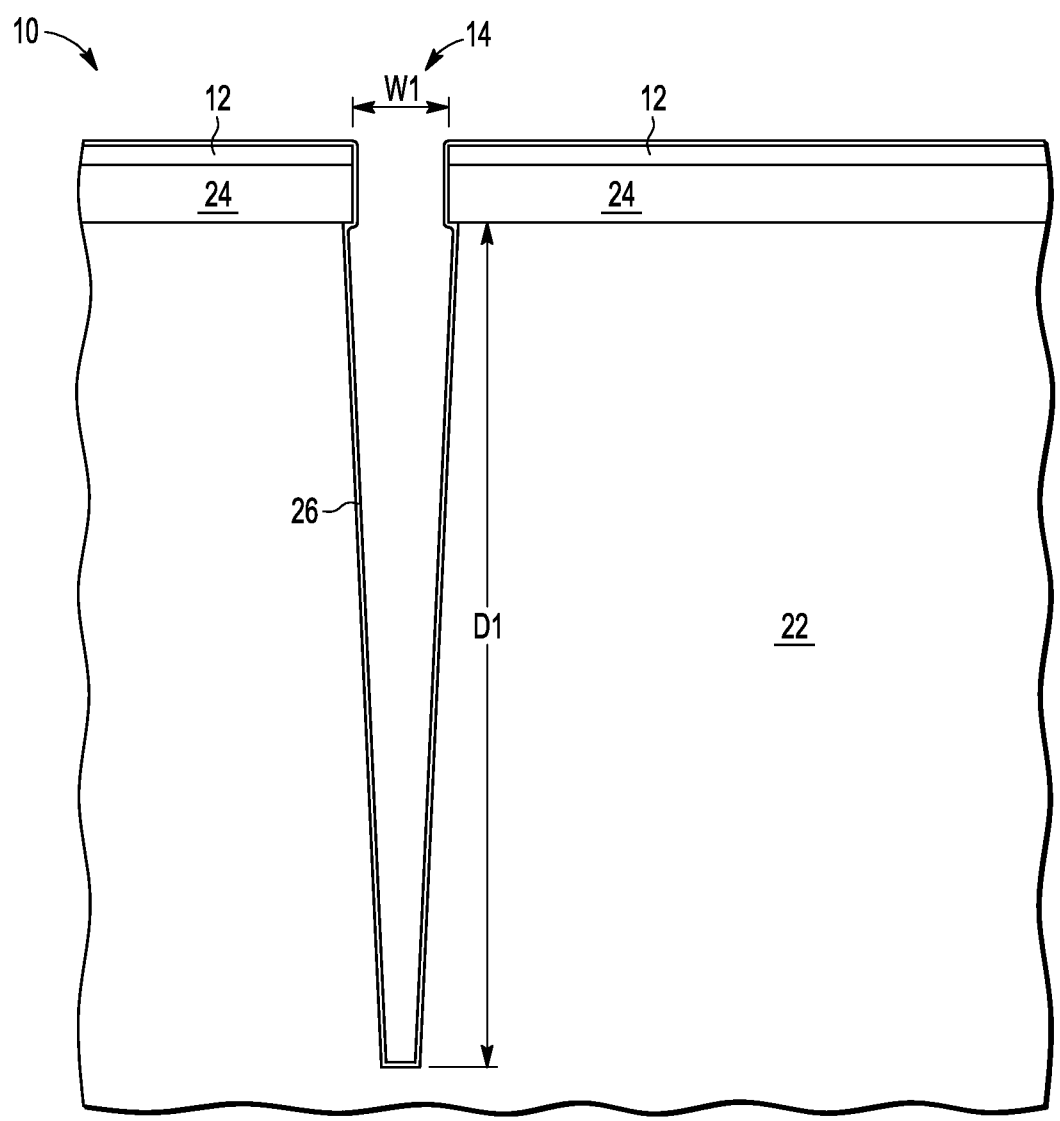
FIG. 4 illustrates a cross-sectional view of the semiconductor structure of FIG. 3 after formation of a liner layer within the opening, in accordance with an embodiment of the present invention.

FIG. 4 illustrates a cross-sectional view of structure 10 after formation of a liner layer 26 within opening 14, in accordance with an embodiment of the present invention. In one embodiment, liner layer 26 is deposited over hard mask layer 12 and within opening 14. In one embodiment, liner layer 26 includes more than one conductive layer, such as, for example, a titanium layer and a titanium nitride layer over the titanium layer. Alternatively, additional or different layers may be present within liner layer 26 such as one or more dielectric layers and/or one or more conductive layers. In one embodiment, each layer of liner layer 26 is sequentially deposited. In one embodiment, liner layer 26 is in a range of 200 to 400 microns. In one embodiment, liner layer 26 may be approximately 340 microns. In one embodiment, prior to forming liner layer 26, a sacrificial liner may be formed and removed in order to clean up the rough surfaces of substrate 22 within opening 14.

Figure 5:
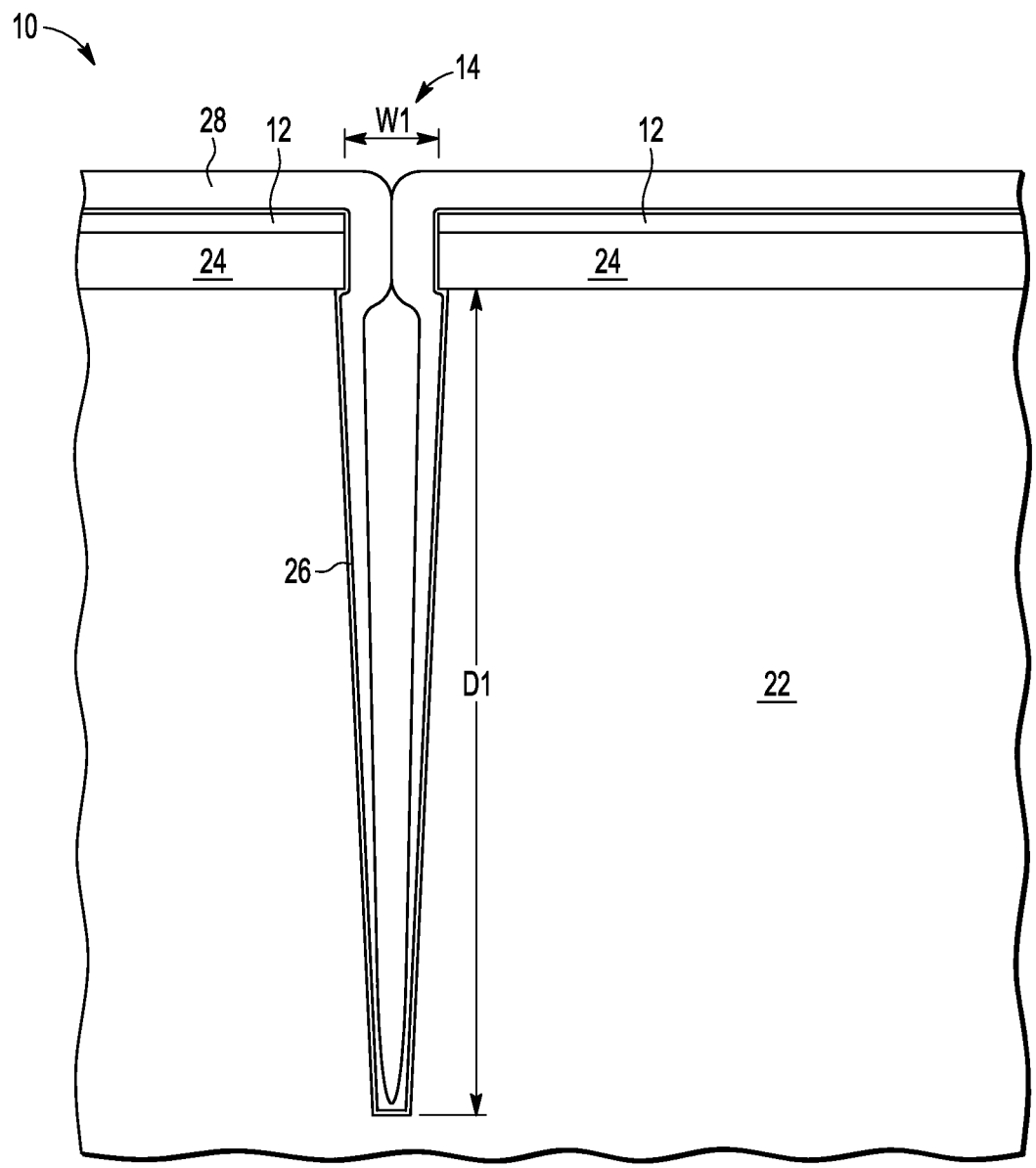
FIG. 5 illustrates a cross-sectional view of the semiconductor structure of FIG. 4 after formation of a first conductive layer within the opening, in accordance with an embodiment of the present invention.

FIG. 5 illustrates a cross-sectional view of structure 10 after formation of a conductive layer 28 within opening 14, in accordance with an embodiment of the present invention. In one embodiment, conductive layer 28 is deposited by chemical vapor deposition (CVD) to a thickness of approximately 1 micron. In one embodiment, the deposition results in conductive layer 28 contacting each other at the top of opening 14, closing off opening 14 within substrate 22. In one embodiment, conductive layer 28 comprises a conductive material such as, for example, tungsten, copper, or polysilicon.

Figure 6:
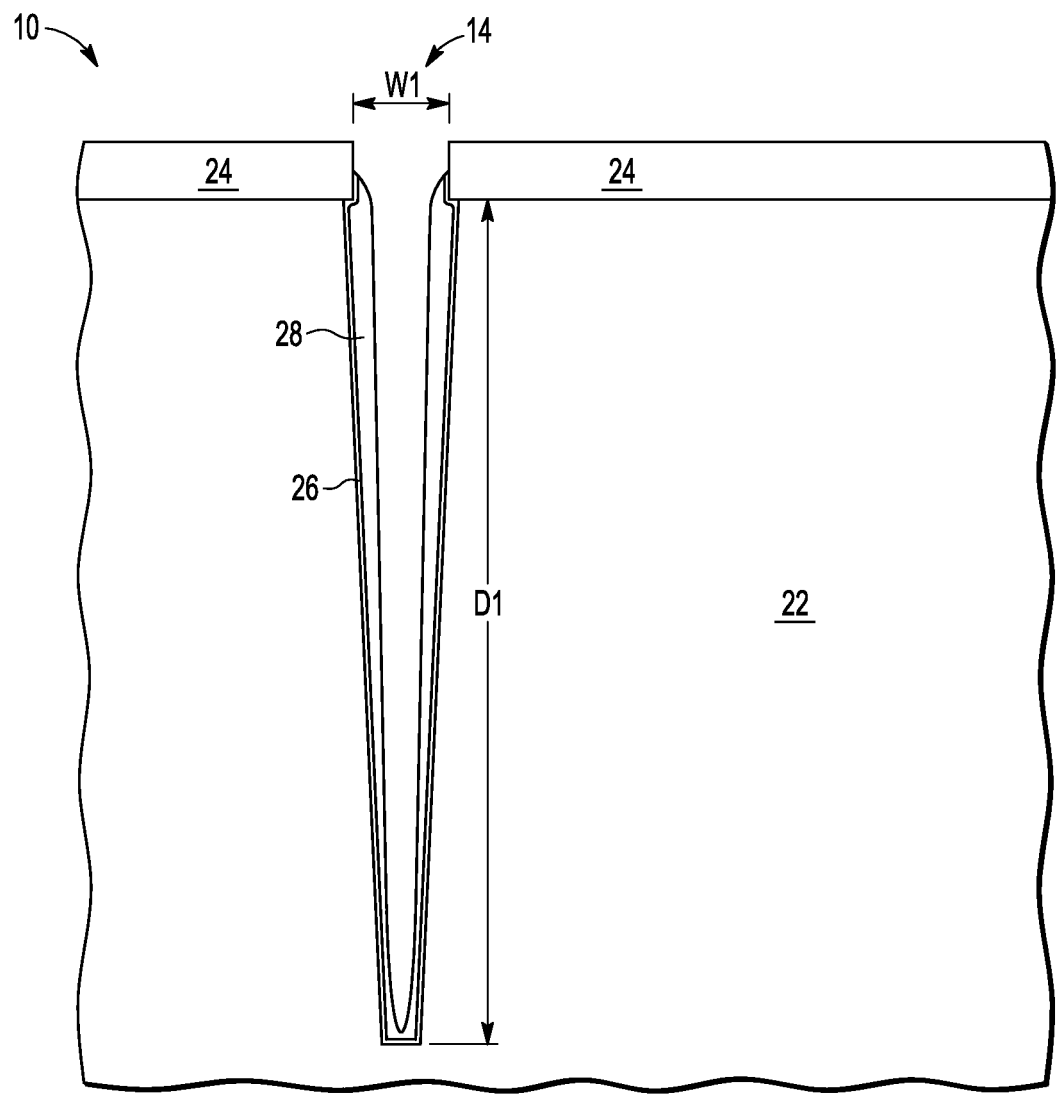
FIG. 6 illustrates a cross-sectional view of the semiconductor structure of FIG. 5, after etching the first conductive layer, in accordance with an embodiment of the present invention.

FIG. 6 illustrates a cross-sectional view of structure 10 after etching first conductive layer 28, in accordance with an embodiment of the present invention. Conductive layer 28 is etched back in order to open the top of opening 14. The etch also removes portions of conductive layer 28 and liner layer 26 located over hard mask layer 12, and also removes the remaining portions of hard mask layer 12.

Figure 7:
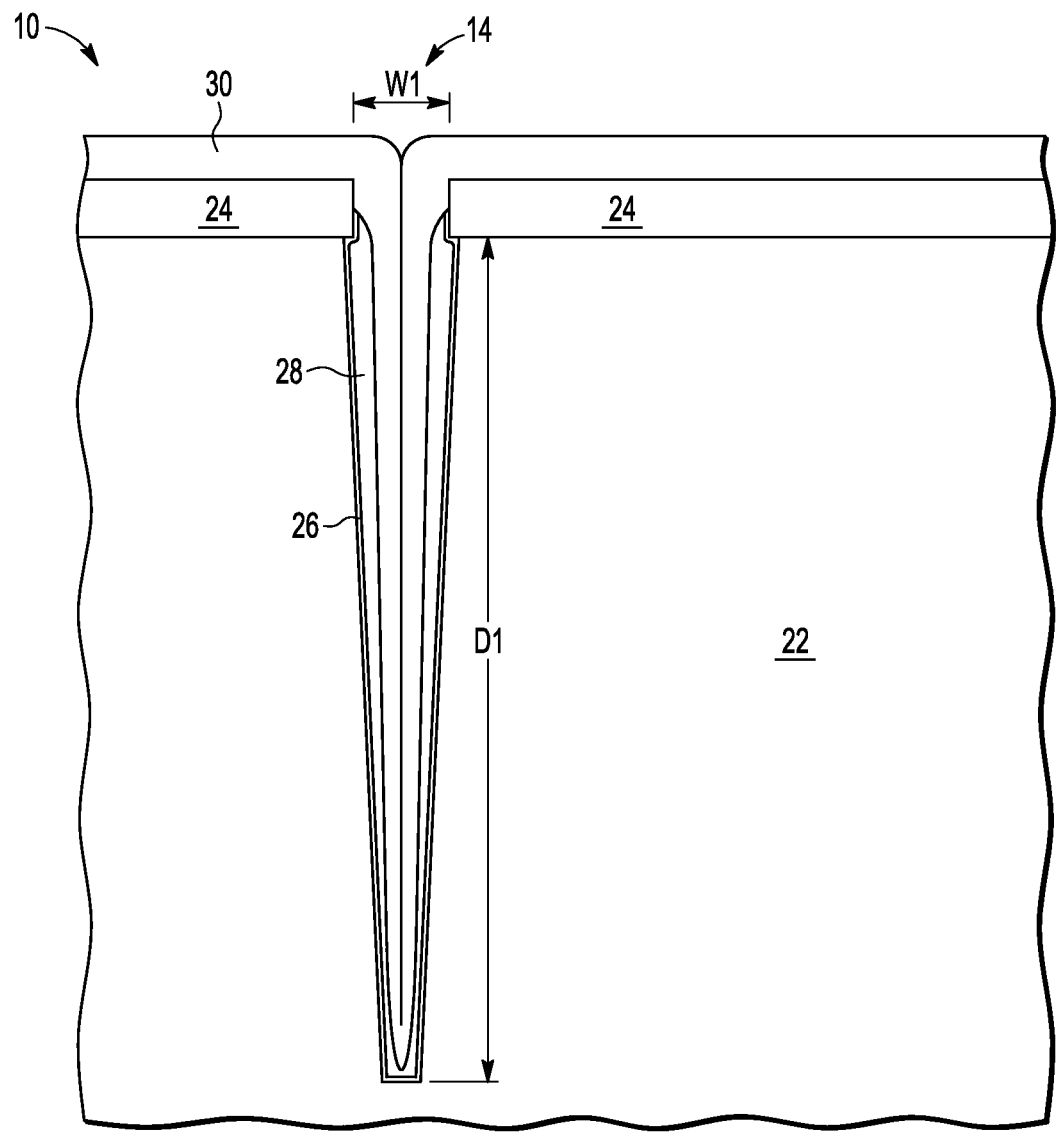
FIG. 7 illustrates a cross-sectional view of the semiconductor structure of FIG. 6, after formation of a second conductive layer within the opening, in accordance with an embodiment of the present invention.

FIG. 7 illustrates a cross-sectional view of structure 10 after formation of a conductive layer 30 within opening 14, in accordance with an embodiment of the present invention. In one embodiment, conductive layer 30 is deposited by CVD to a thickness of approximately 1 micron. In one embodiment, conductive layer 30 completely fills opening 14. Deposition of conductive layer 30 may result in a seam within opening 14. In one embodiment, conductive layer 30 comprises a conductive material, such as, for example, tungsten, copper, or polysilicon, and may be of the same conductive material as conductive layer 28.

Figure 8:
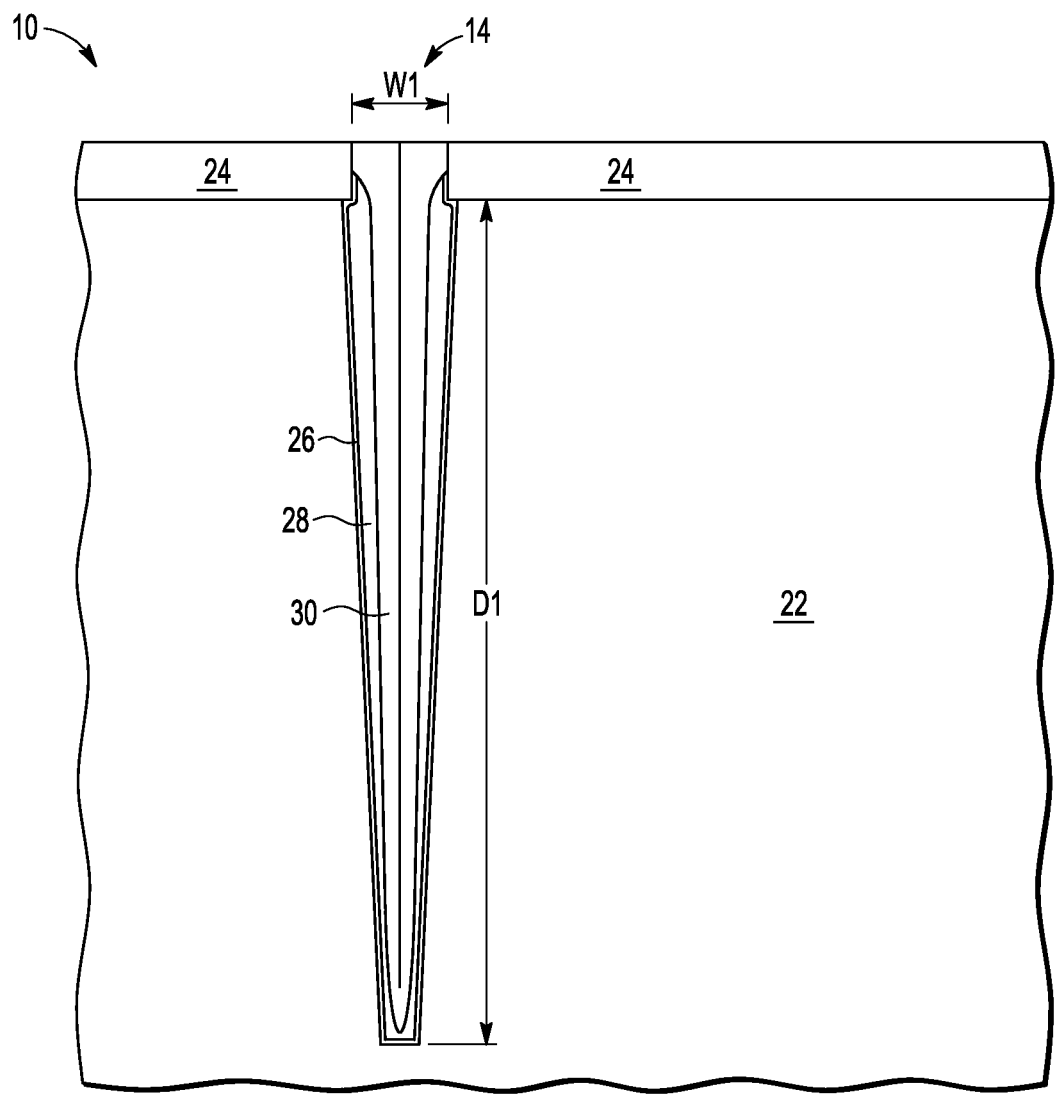
FIG. 8 illustrates a cross-sectional view of the semiconductor structure of FIG. 7, after removing portions of the second conductive layer, in accordance with an embodiment of the present invention.

FIG. 8 illustrates a cross-sectional view of structure 10 after removing portions of conductive layer 30, in accordance with an embodiment of the present invention. In one embodiment, a chemical mechanical polish (CMP) is performed to remove portions of conductive layer 30 extending above a top surface of hard mask layer 12, thus exposing hard mask layer 12. In one embodiment, a portion of the top surface of hard mask layer 12 is also removed. Therefore, at this point in processing, opening 14 has been filled with a conductive material, such as tungsten, copper, or polysilicon. In alternate embodiments, different processes may be used to fill opening 14 with the conductive material, such as by using greater or fewer conductive layers. Also, in alternate embodiments, different materials, such as one or more dielectric materials, may be used to fill opening 14.

Figure 9:
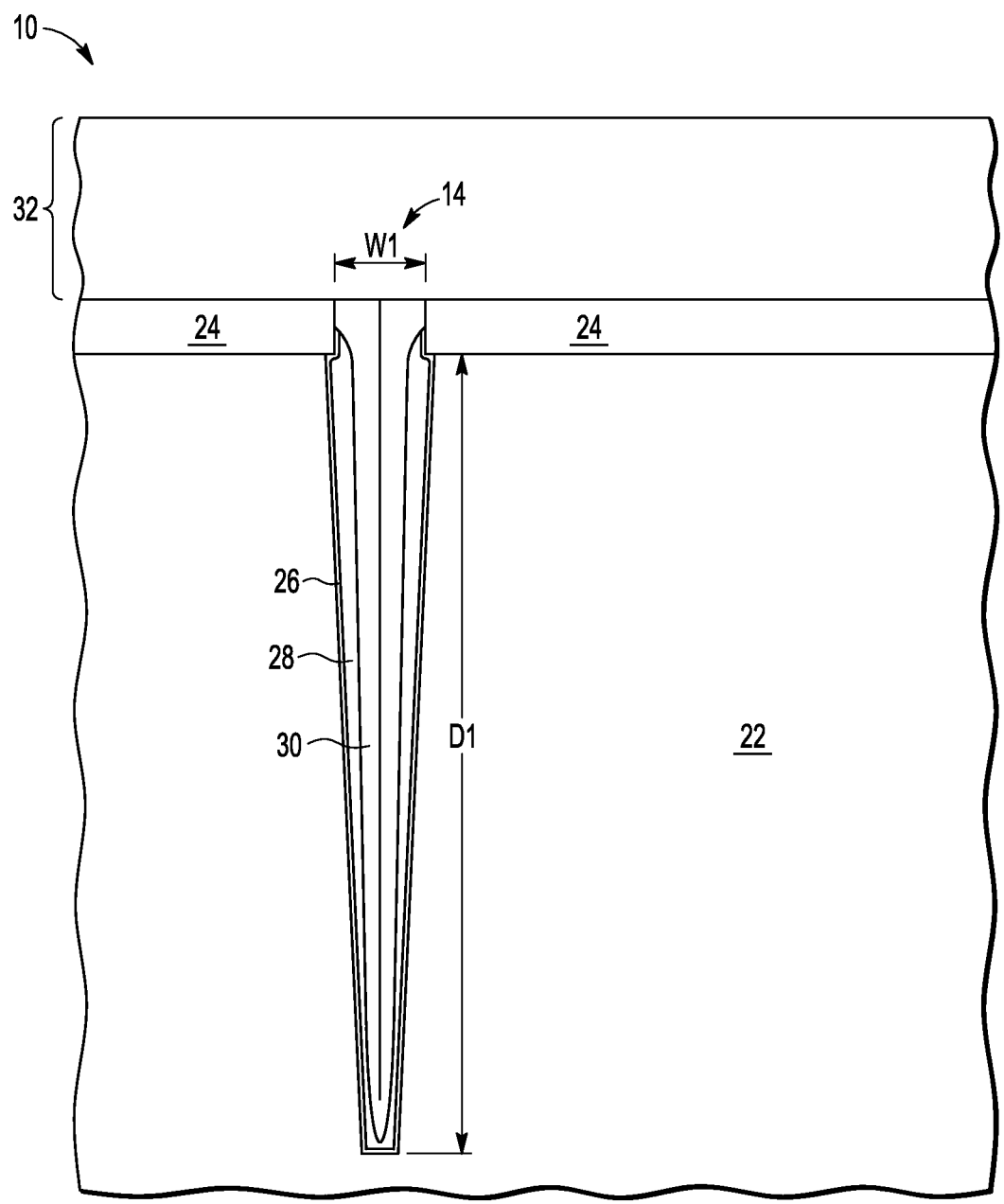
FIG. 9 illustrates a cross-sectional view of the semiconductor structure of FIG. 8 after forming one or more additional interconnect layers, in accordance with an embodiment of the present invention.

FIG. 9 illustrates a cross-sectional view of structure 10 after forming one or more additional interconnect layers 32, in accordance with an embodiment of the present invention. Therefore, in one embodiment, additional layers, as needed, may be formed to complete processing on the top side of substrate 22. This may include, for example, the formation of one or more interconnect layers to route signals.

Figure 10:
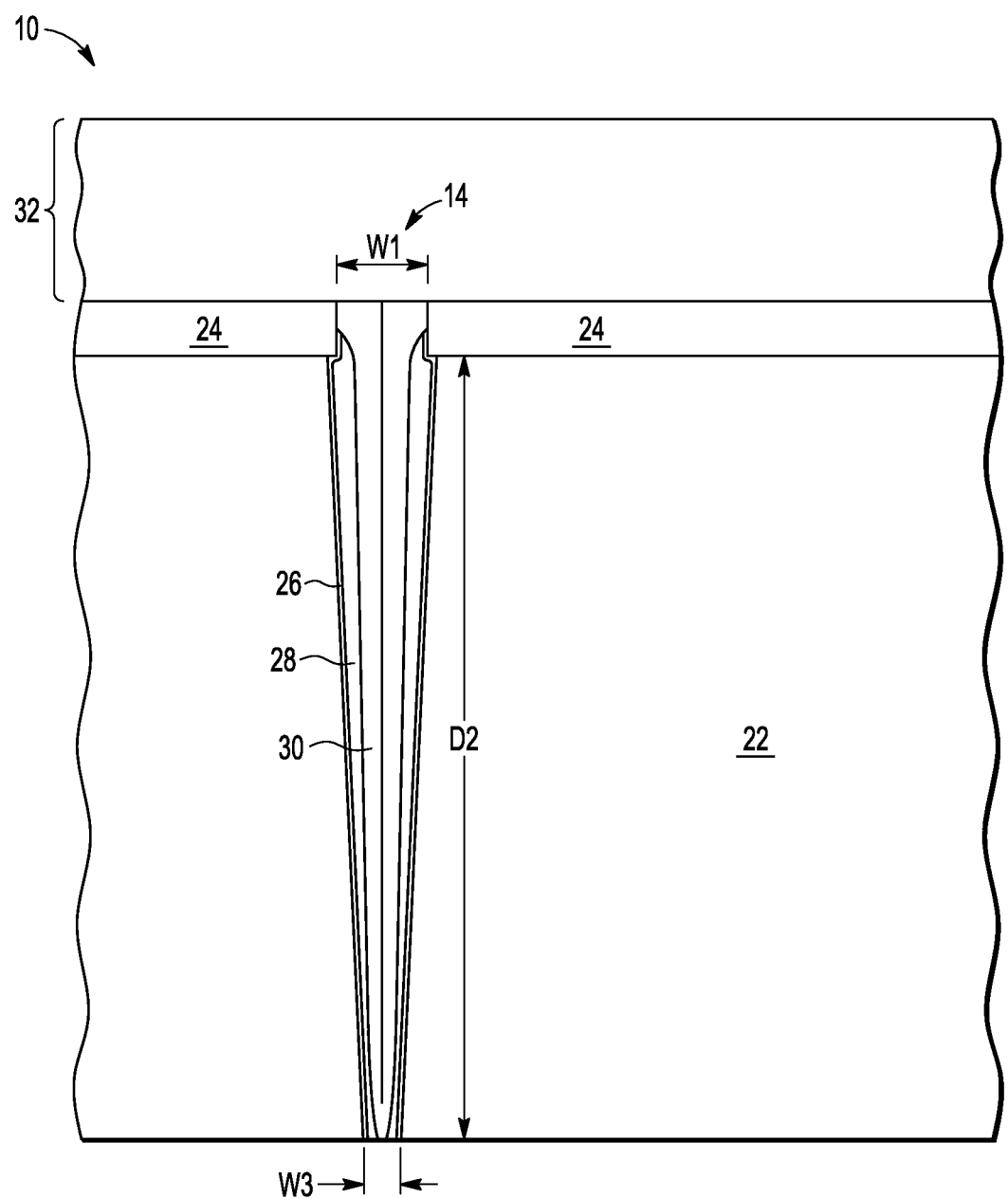
FIG. 10 illustrates a cross-sectional view of the semiconductor structure of FIG. 9 after performing a backside grind, in accordance with an embodiment of the present invention.

FIG. 10 illustrates a cross-sectional view of structure 10 after performing a backside grind, in accordance with an embodiment of the present invention. In one embodiment, a grind is performed on the backside of substrate 22, opposite the top surface of substrate 22, to expose opening 14 which has been filled. In this manner, opening 14 forms a TSV which extends from a top surface of substrate 22 to a bottom surface (or backside) of substrate 22. Opening 14 now has a depth of D2, which may be in a range of 50 to 140 microns, and in one embodiment, is approximately 60 microns. In the illustrated embodiment, opening 14 is filled with a conductive material to allow for the routing of power and ground from the top side of substrate 22 to the backside of substrate 22. For example, a ground connection can be made to conductive layers 28 and 30 (the conductive filling of opening 14) at the bottom surface of substrate 22. Opening 14 has a width W1 at the top of hard mask layer 12 (and top of substrate 22), but narrows as it extends into substrate 22 where it has a width of W3 at the backside of substrate 22. In one embodiment, the width of opening 14 is reduced by an amount of W1-W3. Note that for each of features 16, 18, and 20, the width of opening 14 would be wider, starting with W2 at the top side of hard mask layer 12 (rather than W1), and the width would be reduced by the amount W1-W3 at the backside of substrate 22. Therefore, note that the slope of the walls of opening 14 as it extends into substrate 22 remains the same at features 16, 18, and 20 as at locations between the features. In alternate embodiments, a slope profile with a greater or lesser slope may be used. In one embodiment, a straight profile, in which the walls of the opening are substantially vertical, may be used. After the backside grinding, additional processing may be performed on the backside of substrate 22. For example, a conductive layer may be deposited on the backside to electrically connect one or more TSVs formed in substrate 22 to circuitry at the frontside of substrate 22.

Therefore, after the backgrind of substrate 22, substrate 22 includes a through via (e.g. opening 14) from a top surface of substrate 22 through substrate 22 to the bottom surface of substrate 22, and includes a conductive material (e.g. conductive layers 28 and 30) in substrate 22 which forms the through via. The conductive material has a first feature, a second feature, and a conductive line between the first feature and the second feature (e.g. the portion of the conductive filled TSV that is located between features 16 and 18 or features 18 and 20 or between features 16 and 20). The conductive line has a minimum width (e.g. W1) at the top surface of substrate 22, the first and second features have a maximum width (e.g. W2) at the top surface of substrate 22, and the conductive line has a length (e.g. L1) at the top surface of substrate 22. In one embodiment, the maximum width is at least twice the minimum width, and the length is at least five times the minimum width.

Figure 11:
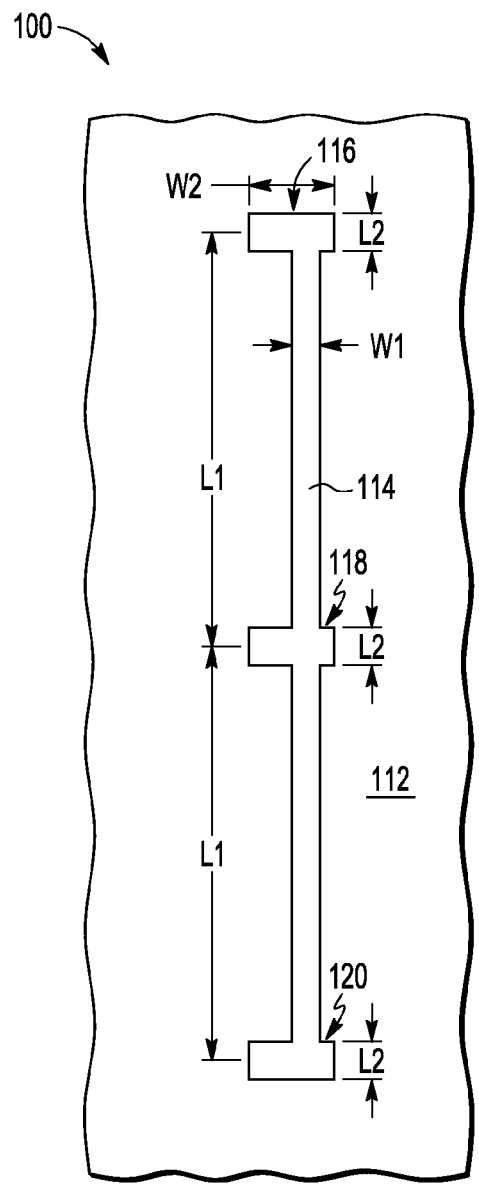
FIG. 11 illustrates a top down view of a semiconductor structure having an opening formed within a hard mask layer, in accordance with an embodiment of the present invention.

FIG. 11 illustrates a top down view of a semiconductor structure 100 having an opening 114 formed within a hard mask layer 112, in accordance with an embodiment of the present invention. Structure 100 is similar to structure 10 except that features 116, 118, and 120 are asymmetrical such that they extend further to one side than the other. The descriptions of widths W1 and W2 and of lengths L1 and L2 remain the same as those described above with respect to structure 10. Also, the same processing described above with respect to FIGS. 1-10 may also be used to form structure 100. In an alternate embodiment, each of features 116, 118, and 120 may extend to only one side or the other of the trench portion of opening 114 between the features. Furthermore, feature 118 may not be present or any number of features may be present between features 116 and 120.

Figure 12:
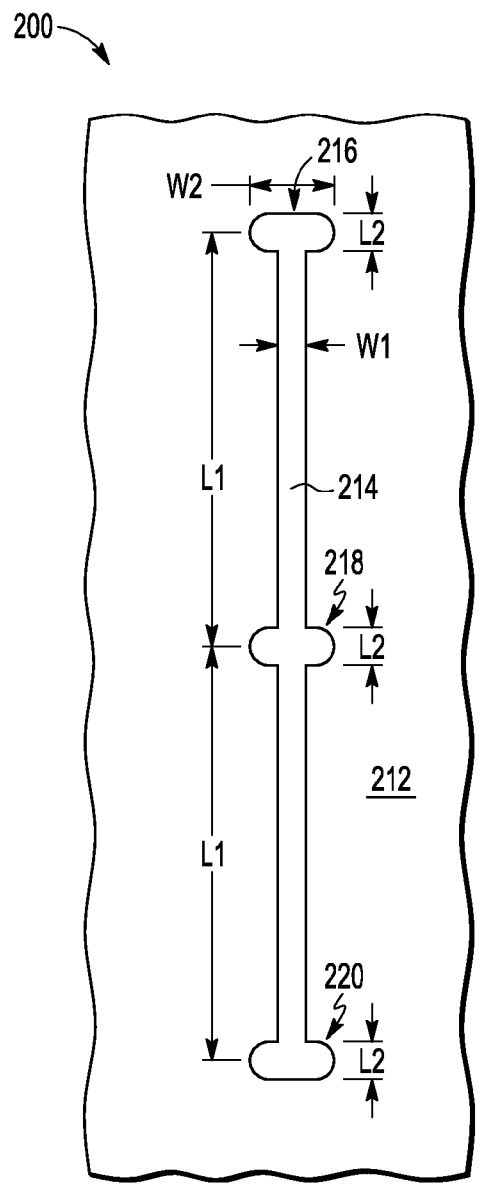
FIG. 12 illustrates a top down view of a semiconductor structure having an opening formed within a hard mask layer, in accordance with an embodiment of the present invention.

FIG. 12 illustrates a top down view of a semiconductor structure 200 having an opening 214 formed within a hard mask layer 212, in accordance with an embodiment of the present invention. Structure 200 is similar to structure 10 except that features 216, 218, and 220 are substantially oval shaped. The descriptions of widths W1 and W2 and of lengths L1 and L2 remain the same as those described above with respect to structure 10. Also, the same processing described above with respect to FIGS. 1-10 may also be used to form structure 200. In an alternate embodiment, each of features 216, 218, and 220 may also be asymmetrical, as described above with respect to FIG. 11. Furthermore, feature 218 may not be present or any number of features may be present between features 216 and 220.

As can be seen from openings 14, 114, and 214, different shapes (such as, for example, substantially rectangular shaped or substantially oval shaped) may be used to reshape the ends of the opening, or may be formed along the length of the opening, in order to relieve stress resulting from filling the opening. Any combination of shapes may be used to reshape the opening, and the shapes may be symmetrical or asymmetrical about the length of the opening. Therefore, by now it should be appreciated that there has been provided a method for reshaping a TSV which may result in reduced stress and thus better performance of the resulting filled TSV. Furthermore, note that, in alternate embodiments, the filled TSV described herein with respect to FIGS. 1-12 may be used in a variety of applications. For example, substrate 22 may be a semiconductor wafer substrate in which active circuitry may be located adjacent opening 14. Alternatively, substrate 22 may be a semiconductor substrate used in packaging, such as an interposer substrate.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, features of different shapes may be used to reshape a TSV, where these features may be located at the ends of a TSV and/or at various locations along the length of the TSV. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a structure having a substrate, including an opening in the substrate having depth from a top surface of the substrate to a bottom surface of the substrate; and a conductive material filling the opening; wherein the opening has a length direction and a width direction; has a first feature and a second feature spaced apart by a first length, wherein the first feature has first width as a maximum width of the first feature and the second feature has a second width as the maximum width of the second feature; and has a minimum width between the first feature and the second feature that is no more than one fifth the first length, wherein the first width and the second width are each at least twice the minimum width. Item 2 includes the structure of item 1, and further includes a third feature spaced from the second feature by a second length, wherein the third feature has a third width as a maximum width of the third feature, the third width is a least twice the minimum width, and the minimum width is no more than one fifth the second length. Item 3 includes the structure of item 2, wherein the first feature is at a first end of the opening and the third feature is at a second end of the opening. Item 4 includes the structure of item 1, wherein the first feature is at a first end of the opening and the second feature is at a second end of the opening. Item 5 includes the structure of item 1, wherein the first feature has a length less than the first width. Item 6 includes the structure of item 1, wherein the first feature has a substantially rectangular shape. Item 7 includes the structure of item 1, wherein the first feature has a substantially oval shape. Item 8 includes the structure of item 1, wherein the substrate comprises a semiconductor material. Item 9 includes the structure of item 1, wherein a ground connection is made to the conductive filling at the bottom surface of the substrate. Item 10 includes the structure of item 1, and further includes an interconnect layer over the conductive filling at the top surface of the substrate.

Item 11 includes a method of forming a through via in a substrate, including forming an opening in at a top surface of a substrate to a first depth; filling the opening with conductive material; and backgrinding a bottom surface of the substrate to expose the conductive material, wherein the opening has a first feature and a second feature separated by a first length along a length direction of the opening, wherein the first feature and the second feature have a maximum width, and has a minimum width between the first feature and the second feature, wherein the minimum width is no more than half the maximum width and no more than one fifth the first length. Item 12 includes the method of item 11, wherein the step of filling comprises forming a conductive liner in the opening of a first conductive material; and filling the opening with a second conductive material. Item 13 includes the method of item 12, and further includes forming a dielectric layer in the opening prior to forming the conductive liner. Item 14 includes the method of item 12, wherein the second conductive material comprises tungsten. Item 15 includes the method of item 14, wherein the step of filling the opening with a second conductive material includes depositing the second conductive material in the opening to partially fill the opening: performing an etch back; and completing filling the opening with the second conductive material. Item 16 includes the method of item 11, wherein the opening is further characterized as having a third feature spaced from the second feature by a second length, wherein the third feature has a third width as a maximum width of the third feature, the third width is a least twice the minimum width, and the minimum width is no more than one fifth the second length. Item 17 includes the method of item 12, wherein the first feature has a substantially rectangular shape. Item 18 includes the method of item 12, wherein the first length is at least ten times the minimum width.

Item 19 includes a structure having a through via from a top surface of a substrate through the substrate to a bottom surface of the substrate, including a conductive material in the substrate forming the through via, wherein the conductive material has a first feature, a second feature, and a conductive line between the first feature and the second feature; the conductive line has a minimum width at the top surface of the substrate; the first feature and the second feature have a maximum width at the top surface of the substrate; the conductive line has a first length at the top surface; the maximum width is at least twice the minimum width; and the first length is at least five times the minimum width. Item 20 includes the structure of item 19, wherein the conductive material further comprises a third feature spaced from the second feature by a second length, wherein the third feature has a third width as a maximum width of the third feature, the third width is a least twice the minimum width, and the minimum width is no more than one fifth the second length.

What is claimed is:

1. A structure having a semiconductor substrate, comprising:
    an opening in the substrate having depth from a top surface of the substrate to a bottom surface of the substrate; and
    a conductive material filling the opening;
    wherein the opening:
        has a length direction and a width direction, wherein the width direction is substantially perpendicular to the length direction;
        has a first feature and a second feature spaced apart by a first length, wherein the first length is substantially parallel to the length direction, and wherein the first feature has a first width as a maximum width of the first feature and the second feature has a second width as the maximum width of the second feature; and
        has a minimum width located between the first feature and the second feature that is no more than one fifth the first length, wherein the first width and the second width are each at least twice the minimum width, wherein each of the first width, the second width, and the minimum width is substantially parallel to the width direction.

2. The structure of claim 1, further comprising:
    a third feature spaced from the second feature by a second length, wherein the third feature has a third width as a maximum width of the third feature, the third width is at least twice the minimum width, and the minimum width is no more than one fifth the second length.

3. The structure of claim 2, wherein the first feature is at a first end of the opening and the third feature is at a second end of the opening.

4. The structure of claim 1, wherein the first feature is at a first end of the opening and the second feature is at a second end of the opening.

5. The structure of claim 1, wherein the first feature has a length less than the first width.

6. The structure of claim 1, wherein the first feature has a substantially rectangular shape.

7. The structure of claim 1, wherein the first feature has a substantially oval shape.

8. The structure of claim 1, wherein the substrate comprises a semiconductor material.

9. The structure of claim 1, wherein a ground connection is made to the conductive filling at the bottom surface of the substrate.

10. The structure of claim 1, further comprising an interconnect layer over the conductive filling at the top surface of the substrate.

11. A structure, comprising:
    a through via from a top surface of a semiconductor substrate through the substrate to a bottom surface of the substrate; and
    a conductive material in the substrate forming the through via, wherein:
        the conductive material has a first feature, a second feature, and a conductive line between the first feature and the second feature;
        the conductive line has a minimum width at the top surface of the substrate;
        the first feature and the second feature have a maximum width at the top surface of the substrate;
        the conductive line has a first length at the top surface, wherein the minimum width is substantially perpendicular to the first length, and the maximum width is substantially perpendicular to the first length;

the maximum width is at least twice the minimum width; and the first length is at least five times the minimum width.

12. The structure of claim 11, wherein the conductive material further comprises a third feature spaced from the second feature by a second length, wherein the third feature has a third width as a maximum width of the third feature, the third width is a least twice the minimum width, and the minimum width is no more than one fifth the second length.

* * * * *